US012760158B2

(12) United States Patent
Fukaya

(10) Patent No.: US 12,760,158 B2
(45) Date of Patent: Oct. 13, 2026

(54) GLASS CLOTH, GLASS CLOTH PRODUCTION METHOD, PREPREG, AND PRINTED WIRING BOARD

(71) Applicant: ASAHI KASEI KABUSHIKI KAISHA, Tokyo (JP)

(72) Inventor: Yuka Fukaya, Tokyo (JP)

(73) Assignee: ASAHI KASEI KABUSHIKI KAISHA, Tokyo (JP)

( * ) Notice: Subject to any disclaimer, the term of this patent is extended or adjusted under 35 U.S.C. 154(b) by 142 days.

(21) Appl. No.: 18/712,844

(22) PCT Filed: Mar. 2, 2023

(86) PCT No.: PCT/JP2023/007843
§ 371 (c)(1),
(2) Date: Jul. 16, 2024

(87) PCT Pub. No.: WO2023/167283
PCT Pub. Date: Sep. 7, 2023

(65) Prior Publication Data
US 2025/0326906 A1 Oct. 23, 2025

(30) Foreign Application Priority Data
Mar. 2, 2022 (JP) ................................ 2022-032046

(51) Int. Cl.
*D03D 15/267* (2021.01)
*C08J 5/24* (2006.01)
(Continued)

(52) U.S. Cl.
CPC ............ *C08J 5/244* (2021.05); *D03D 15/267* (2021.01); *D03D 15/33* (2021.01);
(Continued)

(58) Field of Classification Search
CPC .................................................... D03D 15/267
See application file for complete search history.

(56) References Cited

U.S. PATENT DOCUMENTS

2006/0035552 A1 2/2006 Fujimura et al.
2012/0325534 A1 12/2012 Ito et al.
(Continued)

FOREIGN PATENT DOCUMENTS

CN 106687627 A 5/2017
CN 107532348 A 1/2018
(Continued)

OTHER PUBLICATIONS

International Preliminary Report on Patentability, dated Aug. 30, 2024, and Written Opinion of the International Searching Authority, dated May 16, 2023, for International Application No. PCT/JP2023/007843, with English translation.
(Continued)

*Primary Examiner* — Ian A Rummel
(74) *Attorney, Agent, or Firm* — Birch, Stewart, Kolasch & Birch, LLP

(57) ABSTRACT

Provided is a glass cloth with which suitable impregnation properties with low dielectric resins can be obtained.
A glass cloth includes glass yarns composed of a plurality of glass filaments, woven as warp and weft yarns, and surface-treated with a surface treatment agent, wherein when embedding the glass cloth in an epoxy resin and curing the resin, and thereafter observing a cross section of the glass cloth, a filament adhesion ratio (a number of adhesion points between filaments adhering to each other/total number of filaments) is greater than 0 and 0.80 or less.

14 Claims, 1 Drawing Sheet

(51) Int. Cl.

| | |
|---|---|
| ***D03D 15/33*** | (2021.01) |
| ***D06M 13/513*** | (2006.01) |
| ***D06M 13/52*** | (2006.01) |
| ***D06M 101/00*** | (2006.01) |
| ***H05K 1/03*** | (2006.01) |

(52) U.S. Cl.

CPC ........ *D06M 13/5135* (2013.01); *D06M 13/52* (2013.01); *H05K 1/0306* (2013.01); *H05K 1/0366* (2013.01); *C08J 2363/00* (2013.01); *D06M 2101/00* (2013.01); *D10B 2505/02* (2013.01)

(56) References Cited

U.S. PATENT DOCUMENTS

| | | | |
|---|---|---|---|
| 2014/0145367 | A1 | 5/2014 | Li et al. |
| 2015/0140885 | A1 | 5/2015 | Eder et al. |
| 2017/0260657 | A1 | 9/2017 | Nakai et al. |
| 2018/0094110 | A1 | 4/2018 | Nakanishi et al. |
| 2019/0118508 | A1 | 4/2019 | Saito et al. |
| 2021/0253813 | A1 | 8/2021 | Koshi et al. |
| 2022/0356609 | A1 | 11/2022 | Sato et al. |
| 2023/0189438 | A1 | 6/2023 | Honma et al. |

FOREIGN PATENT DOCUMENTS

| | | | |
|---|---|---|---|
| CN | 109694575 | A | 4/2019 |
| JP | 9-208268 | A | 8/1997 |
| JP | 10-219525 | A | 8/1998 |
| JP | 11-189963 | A | 7/1999 |
| JP | 2000-54255 | A | 2/2000 |
| JP | 2002-293579 | A | 10/2002 |
| JP | 2003-129370 | A | 5/2003 |
| JP | 2010-84236 | A | 4/2010 |
| JP | 2010-216023 | A | 9/2010 |
| JP | 2010-538170 | A | 12/2010 |
| JP | 2013-1902 | A | 1/2013 |
| JP | 2016-84567 | A | 5/2016 |
| JP | 2018-115225 | A | 7/2018 |
| JP | 2019-19431 | A | 2/2019 |
| JP | 2019-104996 | A | 6/2019 |
| JP | 2022-21666 | A | 2/2022 |
| TW | 202022027 | A | 6/2020 |
| TW | 202120764 | A | 6/2021 |
| WO | WO 2017/170781 | A1 | 10/2017 |
| WO | WO 2021/251103 | A1 | 12/2021 |
| WO | WO 2022/038944 | A1 | 2/2022 |

OTHER PUBLICATIONS

International Search Report for International Application No. PCT/JP2023/007843, dated May 16, 2023, with English translation.

GLASS CLOTH, GLASS CLOTH PRODUCTION METHOD, PREPREG, AND PRINTED WIRING BOARD

FIELD

The present invention relates to a glass cloth, a glass cloth production method, a prepreg, and a printed circuit board.

BACKGROUND

Glass cloths are widely used as base materials for printed circuit boards used in electronic devices. In recent years, as information terminals such as smartphones have become more sophisticated and have faster communication speeds, printed circuit boards with lower dielectric properties (for example, lower dielectric constant and lower dielectric loss tangent) are on trend. In order to meet the demand for printed circuit boards with lower dielectric properties, regarding the materials constituting the base materials, a glass cloth treated with a silane coupling agent and a low dielectric resin such as polyphenylene ether (hereinafter also referred to as a "matrix resin") are used, and a method of impregnating the glass cloth with the low dielectric resin is adopted.

Since low dielectric resins such as polyphenylene ether tend to have higher viscosity than conventionally known epoxy resins, etc., resin-unimpregnated portions (voids) of the glass fiber bundle in the substrate are likely to be formed, resulting in CAF (Conductive Anodic Filament) failure. Thus, it is necessary to improve CAF resistance by further increasing the resin impregnation properties.

In general, the improvement of the property of resin impregnation into a glass cloth is carried out as fiber opening processing of the glass cloth, such as a method using a columnar flow or a spray flow, a method using a vibro washer, or a method using high frequency vibration using a liquid as a medium. As methods for improving the resin impregnation properties, a fiber opening method of immersing a glass cloth in a colloidal silica-containing liquid (refer to Patent Literature 1), a method of using a colloidal silica-containing liquid as a glass fiber sizing agent (refer to Patent Literature 2), and a method of immersing a glass cloth in an aqueous dispersion of resin fine particles and elastomer fine particles (refer to Patent Literature 3) have been proposed.

CITATION LIST

Patent Literature

[PTL 1] Japanese Unexamined Patent Publication (Kokai) No. 2010-84236

[PTL 2] Japanese Unexamined Patent Publication (Kokai) No. 9-208268

[PTL 3] Japanese Unexamined Patent Publication (Kokai) No. 2018-115225

SUMMARY

Technical Problem

As the background for glass cloths, there has been a strong desire to further improve the impregnation properties of high viscosity and low dielectric resins such as polyphenylene ether. In the methods described in Patent Literature 1 to 3, there is room for improvement in impregnation properties.

The present invention has been achieved in light of the problems described above, and an object thereof is to provide a glass cloth which has suitable impregnation properties with low dielectric resins, as well as a production method therefor. Another object of the present invention is to provide a prepreg and a printed circuit board using the glass cloth.

Solution to Problem

As a result of investigation in order to achieve the objects described above, the present inventors have discovered that by focusing on the adhesion ratio in the glass cloth and adjusting it within a specified range, the above objects can be achieved, and have completed the present invention.

Specifically, the aspects of the present invention are as described below.

[1]

A glass cloth comprising glass yarns composed of a plurality of glass filaments, woven as warp and weft yarns, and surface-treated with a surface treatment agent, wherein when embedding the glass cloth in an epoxy resin and curing the resin, and thereafter observing a cross section of the glass cloth, a filament adhesion ratio (a number of adhesion points between filaments adhering to each other/total number of filaments) is greater than 0 and 0.80 or less.

[2]

The glass cloth according to Item 1, wherein when curing the resin, the obtained cured product is cut to expose the cross section of the glass cloth, and thereafter the cross section of the glass cloth is observed at a magnification of 2000-fold using a scanning electron microscope, the adhesion ratio is 0.80 or less.

[3]

The glass cloth according to Item 1 or 2, wherein the adhesion ratio is 0.70 or less.

[4]

The glass cloth according to any one of Items 1 to 3, wherein the adhesion ratio is 0.60 or less.

[5]

The glass cloth according to any one of Items 1 to 4, wherein a thickness of the glass cloth is less than 40 μm.

[6]

The glass cloth according to any one of Items 1 to 5, wherein a thickness of the glass cloth is less than 35 μm.

[7]

The glass cloth according to any one of Items 1 to 6, wherein a thickness of the glass cloth is 25 μm or less.

[8]

The glass cloth according to any one of Items 1 to 7, wherein a thickness of the glass cloth is 20 μm or less.

[9]

The glass cloth according to any one of Items 1 to 8, wherein a number of fine particles attached to the glass cloth is 100 particles/μm or less.

[10]

The glass cloth according to any one of Items 1 to 9, having a loss on ignition of value of 0.10 to 1.20% by mass.

[11]

The glass cloth according to any one of Items 1 to 10, wherein a number of fuzz having a length of 1 mm or more observed when a tension of 100 N/1000 mm is applied by roll-to-roll is 10 pieces/$m^2$ or less.

[12]

The glass cloth according to any one of Items 1 to 11, wherein a weft distortion rate is 4% or less.

[13]

A prepreg, comprising the glass cloth according to any one of Items 1 to 12 and a matrix resin composition, with which the glass cloth is impregnated.

[14]

A printed circuit board, comprising the glass cloth according to any one of Items 1 to 12, and a cured product of a matrix resin composition, with which the glass cloth is impregnated.

[15]

A glass cloth production method, for the production of the glass cloth according to any one of Items 1 to 12, comprising the step of:

fiber-opening of the glass cloth by dry ice blast processing.

Advantageous Effects of Invention

According to the present invention, there can be provided a glass cloth which has suitable impregnation properties with low dielectric resins, as well as a production method therefor. Furthermore, according to present invention, there can be provided a prepreg and a printed circuit board using the glass cloth.

DESCRIPTION OF EMBODIMENTS

Figure 1A:
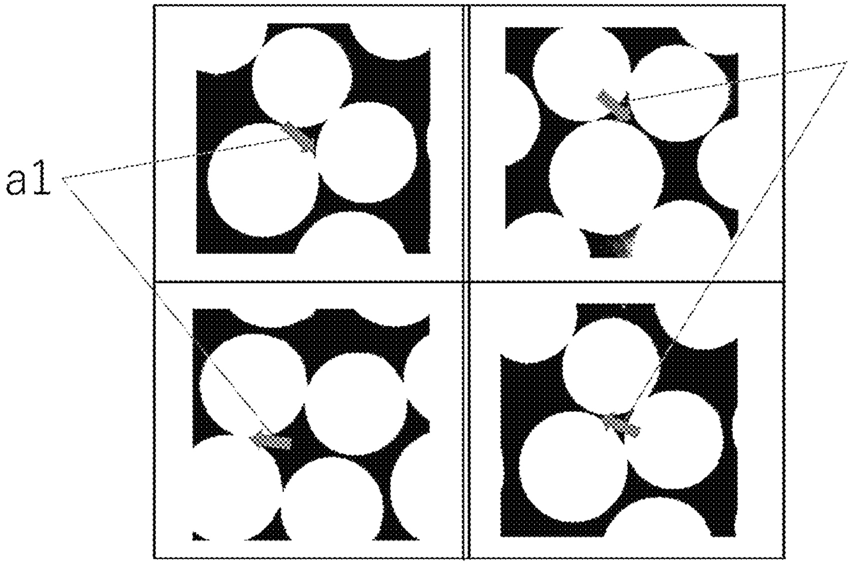
FIG. 1 shows SEM images detailing the method for calculating the "adhesion ratio" of the present embodiment.

The embodiments (hereinafter referred to as "the present embodiment") of the present invention will be described below. However, the present invention is not limited to the following embodiments, and various changes can be made within the scope of the spirit thereof. In the present embodiment, numerical ranges described using "to" include the numbers written before and after "to." Furthermore, in the present embodiment, in numerical ranges described in stages, the upper limit or lower limit described in one numerical range can be replaced with the upper or lower limit of another numerical range described in stages. Further, in the present embodiment, the upper limit value or lower limit value described in a certain numerical range can also be replaced with a value shown in the Examples.

[Schematic Configuration]

The glass cloth of the present embodiment comprises glass yarns composed of a plurality of glass filaments, woven as warp and weft yarns, and surface-treated with a surface treatment agent, wherein when embedding the glass cloth in an epoxy resin and curing the resin, and thereafter observing a cross section of the glass cloth, the filament adhesion ratio is greater than 0 and 0.80 or less. According to such a glass cloth, suitable impregnation properties with low dielectric resins can be obtained. In an aspect, the target to be embedded in an epoxy resin may be at least a part of the glass cloth.

In an aspect, the glass cloth according to the present embodiment is characterized in that:

when embedding the glass cloth in an epoxy resin and curing the resin, the obtained cured product is cut to expose the cross section of the glass cloth, and thereafter the cross section of the glass cloth is observed at a magnification of 2000-fold using a scanning electron microscope, the filament adhesion ratio is 0.80 or less.

Adhesion Ratio

The adhesion ratio can be determined from the ratio between the total number of filaments and the number of adhesion points between filaments adhering to each other, and can be calculated using the following formula:

Adhesion ratio=(number of adhesion points between filaments adhering to each other)/(total number of filaments)

In particular, the glass cloth according to the present embodiment satisfies the following formula:

$$0<\text{adhesion ratio}\leq 0.80 \quad (1)$$

The adhesion ratio is preferably 0.70 or less, and more preferably 0.60 or less.

Glass clothes having an adhesion ratio less than a predetermined value are less likely to impede resin impregnation between the plurality of filaments, and can thus achieve suitable impregnation properties with low dielectric resins. As the fiber-opening treatment method, which is one of the requirements for realizing the adhesion ratio described above, dry ice blast processing is preferable as will be described later. The adhesion ratio can be measured according to the method described in the Examples.

In the above formula, "filaments adhering to each other" include all of:

the case in which one glass filament and another glass filament are adhered;

the case in which the surface-treated layer of one glass filament and another glass filament are adhered; and the case in which the surface-treated layer of one glass filament and the surface-treated layer of another glass filament are adhered.

The epoxy resin in "embedding . . . in an epoxy resin" is a resin for which the adhesion ratio described above can be calculated in accordance with the spirit of the present invention, and specific examples thereof include the resins described in the Examples.

Figure 1B:
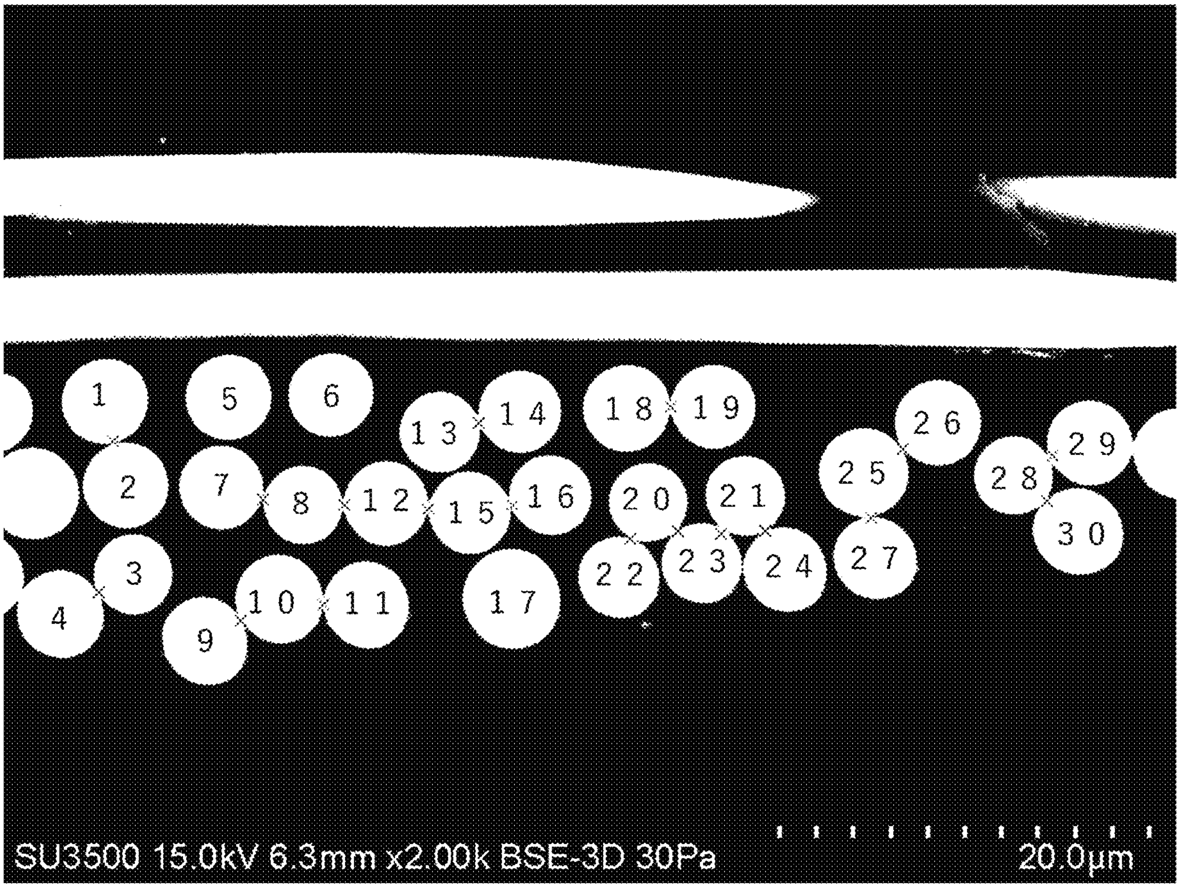

FIGS. 1(*a*) and 1(*b*) are SEM images detailing the method for calculating the "adhesion ratio" of the present embodiment. In the drawings, the cross sections of the filaments are shown as white circles.

In FIG. 1(*a*), the location indicated by arrow a1 corresponds to the adhesion point between filaments, and the location indicated by arrow a2 does not correspond to an adhesion point. When the cross section of a glass cloth is observed at a magnification of 2000-fold using a scanning electron microscope, locations where the cross sections of the filaments (i.e., the circular white shapes indicating the cross sections of the filaments in the SEM image) touch each other by 50 nm or more correspond to "adhesion points" in the present embodiment.

In the present embodiment, the "total number of filaments" and the "number of adhesion points" are counted based on filaments the entire cross section of which is included in the observed image. Filaments having cross sections which are partially cut off from the observed image and adhesion points provided by such filaments are not counted in the "total number of filaments" and "number of adhesion points."

With reference to the example of FIG. 1(*b*), the total number of filaments the entire cross section of which is included in the observed image is 30 (refer to the numbers in white), there are a total of 18 adhesion points where these filaments come into contact with each other (refer to the "x" marks), and filaments which are cut off from the observed image are not counted in the "total number of filaments" and "number of adhesion points." From these, in the example of FIG. 1(*b*), the adhesion ratio is calculated as 18/30=0.6.

Note that the glass cloth may have portions (other portions) which do not correspond to the formula (1) above within a range that does not impede the effects of the present invention.

[Glass Type]

In the present embodiment, as the glass yarns (glass filaments) constituting the glass cloth, E-glass (alkali-free glass), which is generally used for printed circuit board applications; low dielectric constant glasses such as D glass, L glass, NE glass, L2 glass, silica glass, and quartz glass; high-strength glasses such as S glass and T glass; and high dielectric constant glasses such as H glass can be used. The glass yarns may be composed of one type of glass material, or may be a combination of two or more types of glass yarns composed of different glass materials.

[Insertion Density/Interval]

In the present embodiment, the insertion density of the warp and weft yarns constituting the glass cloth is preferably 10 to 120 yarns/inch, and more preferably 60 to 120 yarns/inch.

[Number of Filaments]

In the present embodiment, the number of warp filaments and the number of weft filaments are each preferably 250 or less. When the number of filaments is 250 or less, the thickness of the glass cloth can easily be reduced. From the viewpoint of the strength and handleability of the glass cloth, the number of filaments is preferably 30 or more. The number of warp and weft filaments may be the same or different.

[Filament Diameter]

In the present embodiment, the diameter of the filaments constituting the glass cloth is preferably 3 to 8 μm. From the viewpoint of the strength and safety of the glass cloth, the filament diameter is preferably 3 μm or more. When the filament diameter is 8 μm or less, the thickness of the glass cloth can easily be reduced.

"Filament diameter" referred to herein also referred to as "average filament diameter."

In the present embodiment, the cloth weight (basis weight) of the glass cloth is preferably 8 to 50 g/m$^2$, and more preferably 8 to 30 g/m$^2$.

[Weave Structure of Glass Cloth]

In the present embodiment, examples of the weave structure of the glass cloth include plain weave, basket weave, satin weave, and twill weave. Among these, a plain weave structure is preferable.

[Thickness]

In the present embodiment, from the viewpoint of providing a thin glass cloth suitable for printed circuit boards, the upper limit of the thickness of the glass cloth is preferably less than 40 μm, more preferably less than 35 μm, further preferably 30 μm or less, even further preferably 25 μm or less, and most preferably 20 μm or less, and from the viewpoint of strength, the lower limit is preferably 8 μm or more.

In the past, thin glass clothes could not be subjected to strong fiber-opening treatments due to quality concerns, which made it difficult to obtain suitable impregnation properties with low dielectric resins. However, according to the present embodiment, even in the case of thin glass clothes, suitable impregnation properties with low dielectric resins can be obtained.

The thickness of the glass cloth is determined in accordance with JIS R 3420 7.10. Specifically, using a micrometer, a spindle is gently rotated and brought into light contact parallel to the measurement surface of the sample. The thickness can then be determined by reading the scale after the ratchet makes three sounds.

[Surface Treatment]

In the present embodiment, the glass yarns (including the glass filaments) of the glass cloth are surface-treated with a surface treatment agent. As a result, the reactivity with the matrix resin can be improved.

As the surface treatment agent, it is preferable to use, for example, a silane coupling agent represented by the following general formula (2). By using such a silane coupling agent, moisture absorption resistance tends to be further improved, and as a result, insulation reliability tends to be further improved. Furthermore, it becomes easier to improve the reactivity with the matrix resin.

$$X(R)_{3-n}SiY_n \quad (2)$$

where X is an organic functional group having at least one unsaturated double bond group, each Y is independently an alkoxy group, n is an integer of 1 to 3, and each R is independently a group selected from the group consisting of a methyl group, an ethyl group, and a phenyl group.

X is preferably an organic functional group having at least three or more of an amino group and an unsaturated double bond group, and X is more preferably an organic functional group having at least four or more of an amino group and an unsaturated double bond group.

In general formula (2), the alkoxy group is preferably an alkoxy group having 5 or fewer carbon atoms in order for the glass cloth to be stably treated.

Examples of the silane coupling agent include known simple substances such as N-β-(N-vinylbenzylaminoethyl)-γ-aminopropyltrimethoxysilane and hydrochlorides thereof, N-β-(N-vinylbenzylaminoethyl)-γ-aminopropylmethyldimethoxysilane and hydrochlorides thereof, N-β-(N-di(vinylbenzyl)aminoethyl)-γ-aminopropyltrimethoxysilane and hydrochlorides thereof, N-β-(N-di(vinylbenzyl)aminoethyl)-N-γ-(N-vinylbenzyl)-γ-aminopropyltrimethoxysilane and hydrochlorides thereof, N-vinyltrimethoxysilane, methacryloxypropyltrimethoxysilane, and acryloxypropyltrimethoxysilane, and mixtures of these.

Specific examples of the silane coupling agent include known simple substances such as N-β-(N-vinylbenzylaminoethyl)-γ-aminopropyltrimethoxysilane and hydrochlorides thereof, N-β-(N-vinylbenzylaminoethyl)-γ-aminopropylmethyldimethoxysilane and hydrochlorides thereof, N-β-(N-di(vinylbenzyl)aminoethyl)-γ-aminopropyltrimethoxysilane and hydrochlorides thereof, N-β-(N-di(vinylbenzyl)aminoethyl)-N-γ-(N-vinylbenzyl)-γ-aminopropyltrimethoxysilane and hydrochlorides thereof, N-β-(N-benzylaminoethyl)-γ-aminopropyltriethoxysilane and hydrochlorides thereof, γ-(2-aminoethyl)aminopropyltrimethoxysilane, γ-(2-aminoethyl)aminopropyltriethoxysilane, aminopropyltrimethoxysilane, vinyltrimethoxysilane, methacryloxypropyltrimethoxysilane, and acryloxypropyltrimethoxysilane, and mixtures of these.

Though either water or an organic solvent can be used as the solvent for dissolving or dispersing the silane coupling agent, from the viewpoint of safety and protection of the global environment, it is preferable that water be used as the main solvent. As the method for obtaining a treatment liquid containing water as the main solvent, either a method in which the silane coupling agent is directly poured into water; or a method in which the silane coupling agent is dissolved in a water-soluble organic solvent to form an organic solvent solution, and the organic solvent solution is then poured into water is preferable.

Further, in order to improve the water dispersibility and stability of the silane coupling agent in the treatment liquid, a surfactant can also be used in combination.

[Loss on Ignition Value]

In the present embodiment, the loss on ignition value of the glass cloth is preferably 0.10 to 1.20% by mass, more preferably 0.11 to 1.10% by mass, and further preferably 0.12 to 1.00% by mass. By setting the loss on ignition value to 0.10 to 1.20% by mass, the resin impregnation properties can be secured and heat resistance can be imparted. The "loss on ignition value" as used herein can be measured in accordance with the method described in JIS R 3420. Specifically, first, the glass cloth is arranged in a dryer at 110° C. and dried for 60 minutes. After drying, the glass cloth is transferred to a desiccator, allowed to stand for 20 minutes, and allowed to cool to room temperature. After cooling, the mass (first mass) of the glass cloth is measured in a unit of 0.1 mg or less. Next, the glass cloth is heated in a muffle furnace at 625° C. for 20 minutes. After heating in a muffle furnace, the glass cloth is transferred to a desiccator, allowed to stand for 20 minutes, and allowed to cool to room temperature. After cooling, the mass (second mass) of the glass cloth is measured in a unit of 0.1 mg or less. The difference between the first mass and the second mass is obtained as the loss on ignition value. The amount of silane coupling agent with which the glass cloth is treated is defined in accordance with the loss on ignition value determined by the above measurement method.

[Number of Fine Particles]

The number of fine particles attached to the glass cloth is 100 particles/μm or less. As a result, there is less impact on the environment and the human body as compared to conventional glass cloths, to which nanoparticles such as colloidal silica are attached.

In order to obtain a glass cloth having a number of fine particles of 100 particles/μm or less, a glass cloth to be used needs only to have a number of fine particles of less than or equal to the above value. Such a glass cloth can be obtained via a production process that does not include a step which may cause fine particles to be attached to the glass cloth. Specifically, by producing the glass cloth without steps such as following:

- a step of immersing the glass cloth in a liquid containing fine particles to carry out fiber-opening;
- a step of using a liquid containing fine particles as a glass fiber sizing agent; or
- a step of immersing the glass cloth in an aqueous dispersion of resin fine particles and elastomer fine particles;
- it is possible to obtain a glass cloth in which the number of fine particles is less than or equal to the above value.

It is preferable that the number of fine particles attached to the glass cloth be 0 particles/μm. As a result, it becomes easier to realize a glass cloth which has less impact on the environment and the human body.

It is preferable that the fine particles have a size of 3 μm or less and be inorganic fine particles and/or organic fine particles. In particular, it is preferable that the inorganic fine particles be at least one selected from the group consisting of colloidal silica, crystalline silica, alumina, and boron nitride, and the organic fine particles be at least one selected from the group consisting of polyphenylene ether resins, epoxy resins, and styrene elastomers. As a result, it becomes easier to realize a glass cloth which has less impact on the environment and the human body.

[Number of Fuzz]

Fuzz of 1 mm or more in the glass cloth can be observed when a tension of 100 N/1000 mm is applied by Roll-to-Roll. The number of fuzz is preferably 10 pieces/$m^2$ or less, and more preferably 8 pieces/$m^2$ or less. The lower limit of the number of fuzz is ideally 0 pieces/$m^2$, but may be 1 piece/$m^2$ or more. From the viewpoint of ease of observation and measurement, the number of fuzz may be counted while irradiating with a halogen lamp.

The number of fuzz is counted visually.

[Distortion Rate]

When the distortion rate of weft yarns is within the range of 4% or less, even if the glass cloth has a dielectric constant (Dk) of 5.0 or less and a thickness of 0.013 cm or less, it is easy to suppress or prevent the occurrence of tearing in the surface-treatment step and the prepreg production step. From this point of view, the distortion rate of the weft yarns is more preferably 3% or less, further preferably 2% or less, and even further preferably 1% or less. Furthermore, the lower limit value of the distortion rate of the weft yarns can be 0% or more, or can exceed 0%.

[Glass Cloth Production Method]

The glass cloth production method according to the present embodiment comprises, for example,

- a weaving step of weaving glass yarns to obtain a glass cloth,
- a de-sizing step of reducing a sizing agent attached to the glass yarns of the glass cloth,
- a surface treatment step with a silane coupling agent or the like, and
- a fiber-opening step of performing fiber-opening of the glass yarns of the glass cloth.

In the weaving method, the weft and warp yarns can be woven into a predetermined weave structure.

Examples of the de-sizing method include a method of removing a sizing agent by heating. Note that the sizing agent is used for the purpose of protecting the glass yarns from breakage during the weaving step and the like. Examples of such sizing agents include starch binders and polyvinyl alcohol binders. Starch binders and the polyvinyl alcohol binders contain at least starch and polyvinyl alcohol, respectively, and may be a mixture with waxes.

The temperature at which the sizing agent is removed by heating (heat cleaning) is preferably 300 to 550° C., more preferably 350 to 480° C., and further preferably 370 to 450° C. from the viewpoint of sufficiently removing the sizing agent while maintaining breaking strength.

The heating time may be appropriately adjusted in accordance with conditions such as the heating temperature and the thickness of the glass cloth, and from the viewpoint of sufficiently removing the sizing agent while maintaining breaking strength, is preferably 20 to 80 hours, more preferably 25 to 70 hours, and further preferably 30 to 60 hours.

In the de-sizing step, in which the sizing agent attached to the glass yarns of the glass cloth is reduced, before and/or after the sizing agent is removed by heating, the sizing agent before heating and/or combustion residue attached to the surface of the glass cloth after heating can be removed by washing with water.

Furthermore, examples of the surface treatment method include a method in which a surface treatment agent containing a silane coupling agent at a concentration of 0.1 to 3.0% by mass is brought into contact with the glass cloth, which is then dried. Note that the surface treatment agent can be brought into contact with the glass cloth by immersing the glass cloth in the surface treatment agent, or by applying the surface treatment agent to the glass cloth using a roll coater, die coater, gravure coater, etc. Examples of the method for drying the surface treatment agent include hot air drying and drying methods using electromagnetic waves.

Further, examples of the fiber-opening treatment method include a fiber-opening treatment in which water pressure is applied to the glass cloth; a fiber-opening treatment using high frequency vibration using water (for example, deaerated water, ion-exchanged water, deionized water, electrolyzed cation water, electrolyzed anion water, etc.) as a medium; processing by pressure using rollers; processing by dry ice blasting; and bend processing with a low radius of curvature.

The fiber-opening treatment may be performed simultaneously with weaving or after weaving. The fiber-opening treatment may be performed before or after heat cleaning, or at the same time as heat cleaning, or at the same time as or after a surface treatment, which will be described later. Among these, dry ice blasting is preferable as the method for the fiber-opening treatment.

Dry ice blast processing is a method in which fine particles of dry ice having a particle size of 5 to 300 μm are jetted (sprayed) from a height of 5 to 1000 mm at an air pressure of 0.05 to 1 MPa. A more preferable method is to spray fine particles of dry ice having a particle size of 5 to 300 μm from a height of 5 mm to 600 mm at an air pressure of 0.1 to 0.5 MPa. Within this range, the effect of improving the impregnation properties can be expected without causing a deterioration in quality such as glass yarn breakage.

[Prepreg]

The prepreg according to the present embodiment comprises the low dielectric glass cloth described above and a matrix resin composition, with which the low dielectric glass cloth is impregnated. The prepreg having the above-mentioned glass cloth has a high adhesiveness with the resin, and the yield of the final product is high. Furthermore, as an effect which can be brought about, it is possible to provide a printed circuit board which has excellent dielectric properties and excellent resistance to moisture absorption, whereby fluctuations in dielectric constant are small under the influence of the usage environment, in particular, in high humidity environments.

The prepreg of the present embodiment can be produced by a conventional method. For example, it can be produced by impregnating the glass cloth of the present embodiment with a varnish made by diluting a matrix resin such as an epoxy resin with an organic solvent, volatilizing the organic solvent in a drying oven, and curing the thermosetting resin to a B-stage state (semi-cured state).

As the matrix resin, either a thermosetting resin or a thermoplastic resin can be used. The thermosetting resin is not particularly limited, and examples thereof include:

a) an epoxy resin which is obtained by reacting and curing a compound having an epoxy group, and a compound having at least one of an amino group, a phenol group, an acid anhydride group, a hydrazide group, an isocyanate group, a cyanate group, and a hydroxyl group that react with the epoxy group without a catalyst or with an added catalyst having reaction catalytic ability such as an imidazole compound, tertiary amine compound, urea compound, or phosphorus compound;

b) a radical polymerization curing resin obtained by curing a compound having at least one of an allyl group, a methacrylic group, and an acrylic group using a thermal decomposition catalyst or a photodecomposition catalyst as a reaction initiator;

c) a maleimide triazine resin obtained by reacting and curing a compound having a cyanate group and a compound having a maleimide group;

d) a thermosetting polyimide resin obtained by reacting and curing a maleimide compound and an amine compound; and e) a benzoxazine resin obtained by crosslinking and curing a compound having a benzoxazine ring via heat polymerization.

The thermoplastic resin is not particularly limited, and examples thereof include polyphenylene ether, modified polyphenylene ether, polyphenylene sulfide, polysulfone, polyether sulfone, polyarylate, aromatic polyamide, polyether ether ketone, thermoplastic polyimides, insoluble polyimides, polyamideimides, and fluororesins. Furthermore, a thermosetting resin and a thermoplastic resin may be used together.

[Printed Circuit Board]

The printed circuit board of the present embodiment comprises the prepreg described above. Specifically, the printed circuit board of the present embodiment comprises the glass cloth described above and a cured product of a matrix resin composition, with which the glass cloth described above is impregnated. The printed circuit board of the present embodiment has a high adhesiveness to the resin, and the yield of the final product is high. Furthermore, since it has excellent dielectric properties and moisture absorption resistance, it can also exhibit the effect wherein fluctuations in the dielectric constant are small under the influence of the usage environment, in particular, in high humidity environments. Since the glass cloth described above is used, it is possible to realize a product with fewer voids, which has less impact on the environment and the human body, and has suitable impregnation properties with the low dielectric resin.

EXAMPLES

The present invention will be specifically described below based on Examples.

Example 1

An L glass cloth (style 1035: average filament diameter 5 μm, warp insertion density 66 yarns/inch, weft insertion density 68 yarns/inch, thickness 30 μm) was prepared. The prepared glass cloth was subjected to a de-oiling treatment, a surface treatment, and a fiber-opening treatment to obtain glass cloth 1.

As the de-oiling treatment, a treatment in which the glass cloth was arranged in a heating furnace at an ambient temperature of 350 to 400° C. for 60 hours in order to thermally decompose the spinning and weaving sizing agents attached to the glass cloth was used.

After the de-oiling treatment, the glass cloth was subjected to a surface treatment using a silane coupling agent. Methacryloxypropyltrimethoxysilane (manufactured by Dow Corning Toray Industries, Inc.; Z6030) was used as the silane coupling agent and dispersed in water to obtain a treatment liquid and the glass cloth was immersed therein. Then, the glass cloth was squeezed to remove the liquid and then dried. As a result of the above treatment, the glass cloth was treated with the silane coupling agent (surface treatment).

As the fiber-opening treatment, a treatment in which fiber-opening processing was performed by spraying fine particles of dry ice having a particle size of 5 to 50 μm at an air pressure of 0.4 MPa was used.

Using the evaluation method described below, the adhesion ratio of adjacent filaments was calculated, and it was confirmed that the glass cloth 1 satisfied formula (1), i.e., the glass cloth of the present Example was obtained.

Example 2

Glass cloth 2 was obtained in the same manner as in Example 1, except that an L glass cloth (style 1027: average filament diameter 4 μm, warp insertion density 75 yarns/inch, weft insertion density 75 yarns/inch, thickness 20 μm) was used. Using the evaluation method described below, the adhesion ratio of adjacent filaments was calculated, and it was confirmed that glass cloth 2 satisfied formula (1), i.e., the glass cloth of the present Example was obtained.

Example 3

Glass cloth 3 was obtained in the same manner as in Example 1, except that an E glass cloth (style 1010: average filament diameter 4 μm, warp insertion density 96 yarns/inch, weft insertion density 96 yarns/inch, thickness 11 μm) was used. Using the evaluation method described below, the adhesion ratio of adjacent filaments was calculated, and it was confirmed that glass cloth 3 satisfied formula (1), i.e., the glass cloth of the present Example was obtained.

Comparative Example 1

A glass cloth was obtained in the same manner as in Example 1, except that the fiber-opening processing was performed using a columnar flow discharged from a 0.5 MPa high-pressure water spray. Using the evaluation method described below, the adhesion ratio of adjacent filaments was calculated.

Comparative Example 2

A glass cloth was obtained in the same manner as in Example 2, except that the fiber-opening processing was performed using a columnar flow discharged from a 0.3 MPa high-pressure water spray. Using the evaluation method described below, the adhesion ratio of adjacent filaments was calculated.

Comparative Example 3

A glass cloth was obtained in the same manner as in Example 3, except that the fiber-opening processing was performed using a columnar flow discharged from a 0.5 MPa high-pressure water spray. Using the evaluation method described below, the adhesion ratio of adjacent filaments was calculated.

Measurement and Evaluation

Various measurements and evaluations were performed on each of the glass cloths of the Examples and Comparative Examples.

(Calculation of Adhesion Ratio)

Each glass cloth was embedded in a resin (Epomount, Hardener II, manufactured by Refine Tec Ltd.), the cross section of the glass cloth together with the resin was cut and polished so that the roundness of the glass filaments was 0.9 or more, and the cross section of the glass cloth was observed at a magnification of 2000-fold using a scanning electron microscope SU3500 manufactured by Hitachi High-Tech Corporation. One warp yarn was divided into three sections, and cross-sectional images of a total of five warp yarns were captured. Thereafter, the total number of filaments and the number of adhesion points between filaments adhering to each other in each image were visually counted, and (number of adhesion points between filaments adhering to each other)/(total number of filaments) was calculated. The same operation was performed on the obtained 15 images, and the average value was taken as the adhesion ratio.

(Evaluation of Resin Impregnation Properties (Number of Voids))

After impregnating each glass cloth with castor oil for 3 minutes, the glass cloth was illuminated with an LED light. At a viewing angle of 32 mm×32 mm, the number of voids of 160 μm or more present between glass filaments was measured using a high-precision camera. Voids correspond to portions which are unimpregnated with the matrix resin. Thus, a small number of voids in the glass cloth means that the glass cloth has excellent impregnation properties with the matrix resin.

(Measurement of Number of Attached Fine Particles)

Preparation for measurement was carried out by applying a glass cloth cut into a 4 cm square size to a sample stand using carbon double-sided tape. Using a KEYENCE VHX-D500, an operation of observing 1325 μm each along the warp and weft yarns was performed five times in total, and the frequency of granular foreign particles attached to the glass cloth was determined from the number (particles) and the observed length (μm) of counted granular foreign particles. From the obtained frequency, the number of attached fine particles (particles/μm) was determined.

Measurement Conditions

Measurement mode: ultra-depth observation mode
Magnification: 1000-fold magnification
Preset: 25 mm

[Number of Fuzz]

Each of the glass cloths of Examples and Comparative Examples was subjected to a tension of 100 N/1000 mm by Roll-to-Roll. Next, the surface of the glass cloth was visually observed, and the number of fuzz of 1 mm or more was counted. The counted area was 1 m×2 m, and the number of fuzz (pieces/$m^2$) was calculated by converting the obtained results.

(Distortion Rate)

The distortion rate of the weft yarns of each of the glass cloths of the Examples and Comparative Examples was measured as follows.

The distortion amount of a sample was measured in accordance with JIS L1096. Specifically, one weft yarn in a 1000 mm wide glass cloth stretched on a pair of rollers was visually observed, and using the TD tangent between the rollers and the cloth as a reference line, the amount of displacement from this reference line was measured. The difference between the maximum value and the minimum value of the amount of displacement was calculated as the distortion amount, and this operation was performed five times to calculate the average value.

The weft distortion rate was then calculated from the distortion amount relative to the roller width. The weft distortion rate was calculated using the following formula:

Weft distortion rate (%)={(distortion amount)/(roller width)}×100

The results of the Examples and Comparative Examples are shown in Table 1.

TABLE 1

| | Ex 1 | Ex 2 | Ex 3 | Comp Ex 1 | Comp Ex 2 | Comp Ex 3 |
|---|---|---|---|---|---|---|
| Style | L1035 | L1027 | E1010 | L1035 | L1027 | E1010 |
| Thickness (um) | 30 | 20 | 11 | 30 | 20 | 11 |
| Adhesion ratio | 0.47 | 0.54 | 0.60 | 0.97 | 1.05 | 0.88 |
| Number of attached particles (particles/um) | 0 | 0 | 0 | 0 | 0 | 0 |
| Number of fuzz (pcs/m$^2$) | 3 | 2 | 1 | 4 | 2 | 1 |
| Distortion rate (%) | 1 | 1 | 2 | 1 | 1 | 2 |
| Number of voids (voids) | 8 | 11 | 5 | 756 | 923 | 217 |

The invention claimed is:

1. A glass cloth embedded in an epoxy resin, the glass cloth comprising glass yarns comprising a plurality of glass filaments, woven as warp and weft yarns, and surface-treated with a surface treatment agent, wherein when embedding the glass cloth in the epoxy resin and curing the epoxy resin, and thereafter observing a cross section of the glass cloth, a filament adhesion ratio (a number of adhesion points between filaments adhering to each other/total number of filaments) is greater than 0 and 0.70 or less.

2. The glass cloth according to claim 1, wherein when curing the resin, the obtained cured product is cut to expose the cross section of the glass cloth, and thereafter the cross section of the glass cloth is observed at a magnification of 2000-fold using a scanning electron microscope, the adhesion ratio is 0.70 or less.

3. The glass cloth according to claim 1, wherein the adhesion ratio is 0.60 or less.

4. The glass cloth according to claim 1, wherein a thickness of the glass cloth is less than 40 μm.

5. The glass cloth according to claim 1, wherein a thickness of the glass cloth is less than 35 μm.

6. The glass cloth according to claim 1, wherein a thickness of the glass cloth is 25 μm or less.

7. The glass cloth according to claim 1, wherein a thickness of the glass cloth is 20 μm or less.

8. The glass cloth according to claim 1, wherein a number of fine particles attached to the glass cloth is 100 particles/μm or less.

9. The glass cloth according to claim 1, having a loss on ignition value of 0.10 to 1.20% by mass.

10. The glass cloth according to claim 1, wherein a number of fuzz having a length of 1 mm or more observed when a tension of 100 N/1000 mm is applied by roll-to-roll is 10 pieces/m$^2$ or less.

11. The glass cloth according to claim 1, wherein a weft distortion rate is 4% or less.

12. A prepreg, comprising the glass cloth according to claim 1 and a matrix resin composition, with which the glass cloth is impregnated.

13. A printed circuit board, comprising the glass cloth according to claim 1, and a cured product of a matrix resin composition, with which the glass cloth is impregnated.

14. A glass cloth production method, for the production of the glass cloth according to claim 1, comprising the step of:

fiber-opening of the glass cloth by a dry ice blasting process.

* * * * *